United States Patent [19]
Rose

[11] 3,978,352
[45] Aug. 31, 1976

[54] CONTROL CIRCUIT
[76] Inventor: Ronald N. Rose, 5960 Main St. NE., Minneapolis, Minn. 55432
[22] Filed: Dec. 9, 1974
[21] Appl. No.: 531,208

[52] U.S. Cl. .......................... 307/308; 307/252 F; 328/4; 340/244 C
[51] Int. Cl.² .................................. H03K 17/00
[58] Field of Search ............ 340/235, 244 C; 307/118, 308, 252 F; 328/4; 73/290

[56] References Cited
UNITED STATES PATENTS

| | | | |
|---|---|---|---|
| 3,206,615 | 9/1965 | Pointe ............................... | 328/4 |
| 3,732,435 | 8/1973 | Strandberg, Jr. et al. ......... | 307/118 |
| 3,787,733 | 1/1974 | Peters ............................. | 340/244 C |
| 3,858,102 | 12/1974 | Quinn .............................. | 307/118 X |

Primary Examiner—Stanley D. Miller, Jr.
Assistant Examiner—B. P. Davis
Attorney, Agent, or Firm—Neil B. Schulte

[57] ABSTRACT

A circuit for maintaining any medium between two predetermined limits, as for example, the water level in a sump. Current to drive the sump pump is gated through a programmable unijunction transistor which transistor is turned on by a signal from an upper limit probe in the sump which is activated by the water level reaching the probe position. When the transistor turns on it activates another portion of the circuit also utilizing programmable unijunction transistors which operates to turn off the first transistor in response to a signal from a lower limit probe positioned in the sump at a lower level. Silicon controlled rectifiers or transistor regenerative switch circuits may be substituted for the unijunction transistors.

5 Claims, 3 Drawing Figures

CONTROL CIRCUIT

BACKGROUND OF THE INVENTION

The circuit of the present invention is useful in a number of different control functions including numerous types of liquid level control, maintaining light levels within predetermined limits, opening and closing garage doors, and any other functions where upper and lower limits can be detected by some type of means. In this application the invention is described in relation to maintaining the liquid level in a sump to assist in explaining how the invention operates. It should be understood, however, that the invention is not limited to sump pumps and may be incorporated into a wide variety of different devices in which some measurable quantity is to be kept between predetermined limits.

The prior art recognizes numerous types of control circuits for maintaining various mediums such as liquid level within predetermined limits. These circuits, however, usually require a steady consumption of electrical power even though they are simply in a standby condition which is wasteful of power and unacceptable in circumstances where batteries may be the power source. In addition, these devices often use complicated electro-mechanical switches which are troublesome and require much maintenance. The present invention overcomes these problems by the use of a unique new circuit as described hereinafter.

SUMMARY OF THE INVENTION

Briefly, my invention contemplates a circuit in which there is no power consumption whatsoever in the standby condition. Even while in operation the circuit only utilizes a very small amount of current as will be more clearly evident from the detailed description that follows. If my invention is used in conjunction with a sump pump, as it is described herein, the water level is reduced by means of a water pump, the power to which is controlled by a relay. The power to the relay is in turn supplied from any suitable power source through a programmable unijunction transistor. The sump itself has upper and lower limit probes therein which allow electrical current to flow through the liquid in the sump whenever they come into contact with the liquid. Thus, as the water level in the sump rises to the point where it contacts the upper limit probe the current flow begins therethrough which causes the above mentioned transistor to turn on. When the transistor turns on it stays on until the voltage differential across it is removed. This differential is removed by means of a second portion of the circuit wherein two more programmable unijunction transistors are utilized. This second portion of the circuit, however, is not activated until the first unijunction transistor comes on and therefore there is no current drain anywhere in the circuit in the standby condition but rather only during that portion of time when the circuit is signaling the pump to lower the liquid level in the sump.

When the water level in the sump drops below the lower limit probe the cessation of current therethrough triggers the second portion of the circuit to turn off the first portion. When the water level again reaches the lower limit probe nothing happens because the circuit is completely turned off. Thus, the fluid remains between the upper and lower limit probes but it is not necessary for the circuit to remain on all the time in order to maintain this condition.

It is clear that any medium can be controlled by this circuit merely by substituting suitable sensing devices for the upper and lower limit probes. Also, it is possible to use silicon controlled rectifiers or complementary transistors instead of the unijunction transistors. It may therefore be seen that it is an object of my invention to provide a control circuit for maintaining any desired medium between predetermined limits. Further objects and advantages will become apparent from the following description and drawing.

DESCRIPTION OF THE PREFERRED EMBODIMENT

Figure 1:
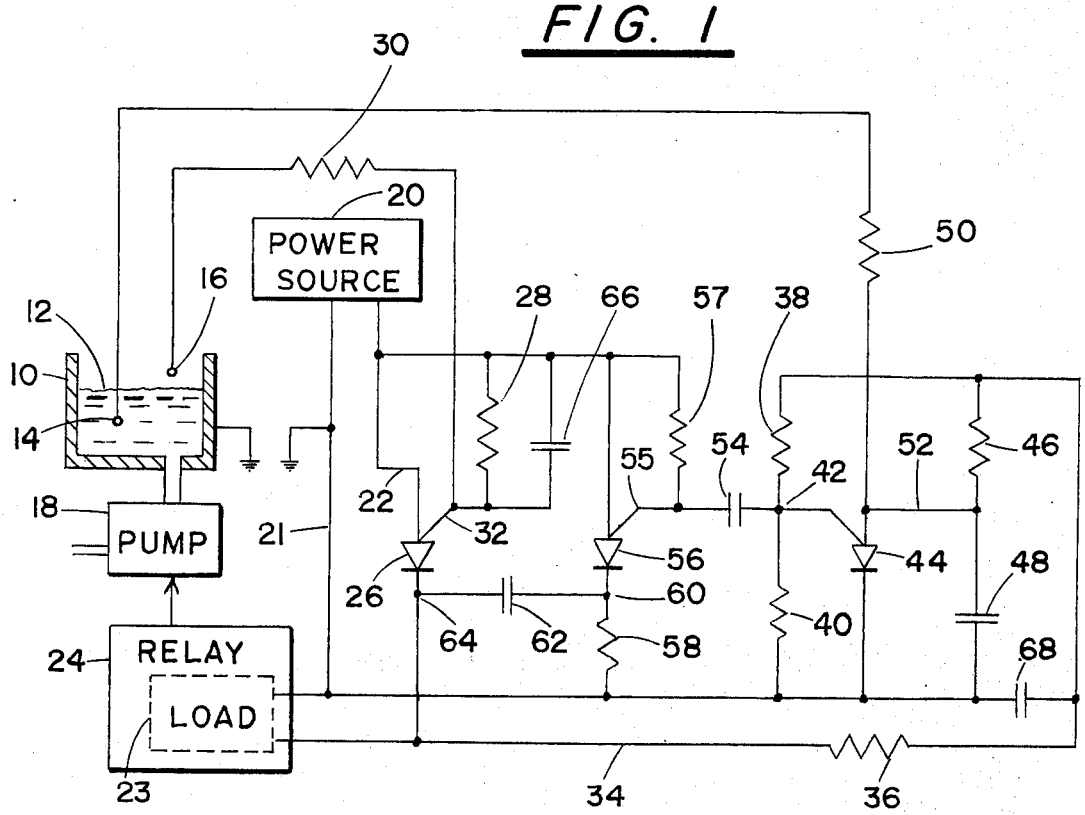
FIG. 1 shows a schematic diagram of the circuit of the present invention as it could be used for maintaining the fluid level in a sump.

In the drawing a sump or fluid container 10 is shown with the fluid 12 therein. A lower limit probe 14 and an upper limit probe 16 are positioned in the container at the physical locations comprising the lower and upper limits of the field respectively. The fluid level is reduced by means of a pump 18 which is turned on by the circuit whenever the fluid level reaches the height of probe 16. The pump is deactivated again when the level drops slightly below probe 14.

The circuit operates by gating power from a power source 20 over a pair of lines 21 and 22 to a suitable load 23. In the case shown in the drawing, load 23 may comprise, for example, a relay 24 which controls the electrical power to pump 18. For the power from power source 20 to reach load 23 it must pass through a programmable unijunction transistor 26. Programmable unijunction transistors operate in response to the reception of a voltage on the gate at a predetermined level below the input level. In the present invention this level is approximately ½ volt. When fluid in the sump 10 reaches probe 16 it grounds out probe 16 allowing current to flow from source 20 through a resistor 28 and resistor 30. This, in effect, creates a voltage divider circuit so that a lower voltage is presented to gate 32 of transistor 26 causing it to turn on. Once the transistor turns on it will remain on until the voltage across it is removed. This function is performed by the remaining parts of the circuit which are activated only upon transistor 26 turning on. Once transistor 26 is turned on current flows not only to load 23 but also down a line 34 through resistors 36, 38 and 40. This establishes a predetermined voltage at point 42 thus activating the remaining portion of the circuit so that another programmable unijunction transistor 44 is ready to be turned on. Meanwhile current also flows through a resistor 46 to charge up a capacitor 48 and thence through resistor 50 and probe 14 to ground so as to establish a voltage at point 52 which is lower than that required to initiate conduction in transistor 44. However, when the liquid level drops below probe 14 in the sump the current ceases and the voltage at point 52 rises relative to point 42 until transistor 44 latches on. When this happens capacitor 48 is immediately discharged through transistor 44. The flow of current from capacitor 48 holds transistor 44 on for a short period of time only. But during this interval the voltage at point 42 drops abruptly following transistor 44 and this voltage drop is coupled through a capacitor 54 to the gate 55 of a programmable unijunction transistor 56. Transistor 56 turns on allowing current to flow through the resistor 58 and causing an abrupt voltage rise at point 60. The voltage rise is coupled through a capacitor 62 to point 64 so as to eliminate the voltage difference across transistor 26 and cause transistor 26 to turn off. The cessation of current from transistor 26 prevents the continued operation of the relaxation oscillator circuit comprising transistor 44 and capacitor 48. Meanwhile the value of resistor 58 is chosen to be large enough to prevent sufficient flow of current through transistor 56 to keep it on. Accordingly transistor 56 also turns off. The circuit has now been returned to a standby condition wherein no current is consumed whatsoever.

The current consumption of the entire circuit is extremely low. Aside from the current flow from the power source to load 23 the only other remaining current flow is the short pulse used to turn on transistor 26 when the water level momentarily reaches the probe 16. During the time pump 18 is lowering the water level the current flow through probe 14 is extremely low due to the choice of large values for resistors 46 and 50. Since the current level is so extremely low the circuit will operate on even the small amount of current conducted through very pure liquids. In fact, experiments have shown that the circuit will operate even in distilled water. Also, since there is less current flow there is less corrosion on the probes 14 and 16 which means a longer operating life and less expense. Increased reliability is also an obvious byproduct. Since no current flows in the standby position the device is suitable for very long term operation with batteries.

A capacitor 66 is utilized to prevent any transients from the power source from accidentally turning on transistor 26. Likewise a capacitor 68 protects against transients that may be produced by the load 23. The following is a chart indicating possible values for all of the components in the circuit which may be used in the preferred embodiment.

| RESISTORS | CAPACITORS | TRANSISTORS |
|---|---|---|
| 28-150K | 48-.001 | 26-G.E. 2N6027 |
| 30-1M | 54-.001 | 44- " |
| 36-1K | 62-1 | 56- " |
| 38-22K | 66-.001 | |
| 40-15K | 68-10 | |
| 46-1M | | |
| 50-1M | | |
| 57-1K | | |

| RESISTORS | CAPACITORS | TRANSISTORS |
|---|---|---|
| 58-150K | | |

Figure 2:
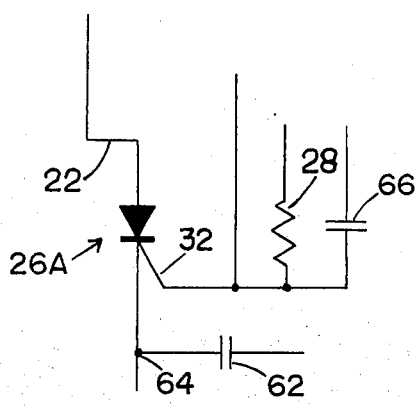
FIGS. 2 and 3 show a portion of the circuit of FIG. 1 with an SCR and a regenerative pair of transistors substituted for the unijunction transistor.
Figure 3:
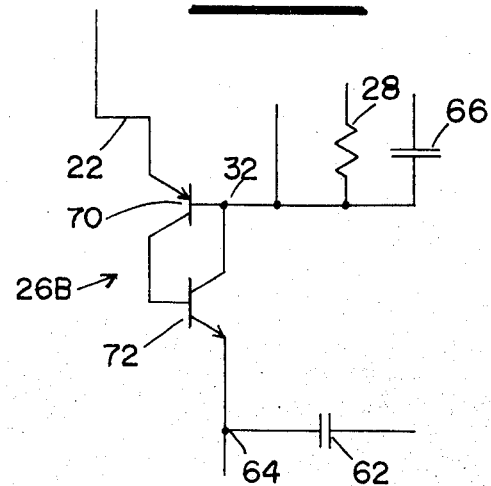

Programmable unijunction transistors are used herein for their superior operating characteristics and low cost. However, the unijunction transistors may be replaced by SCR's, transistor regenerative switches, neon lamps, or any other electronic device that can be caused to latch. In FIG. 2 a portion of the circuit is shown with a SCR 26A substituted for transistor 26. The operation would be substantially identical. In FIG. 3, a pair of transistors 70 and 72 form a transistor regenerative circuit 26B which can be used instead of unijunction transistor 26. The gate signal at point 32 turns on transistor 70 which turns on transistor 72. Transistor 72 holds transistor 70 on until the voltage rises at point 64 turning the circuit 26B off. Thus, since many changes could be made to the circuit without departing from the spirit and scope of the invention I intend to be limited only to the following claims.

I claim:
1. A control circuit for maintaining a medium between predetermined limits comprising:
 upper and lower limit probes operable to detect the presence of said medium at upper and lower limits respectively;
 a power source;
 medium control means operable to vary said medium at least between said upper and lower limits;
 first switching means connected so as to control the flow of power from said power source to said medium control means, said first switching means operable to be switched on by current flow to said upper limit probe;
 second switching means connected so as to be operable upon activation to turn off said first switching means; and
 third switching means operable only after receiving current from the first switching means when the first switching means passes current to the medium control means, and activated by the cessation of a current flow in said lower probe so as to activate said second switching means.
2. The apparatus of claim 1 in which said first, second and third switching means comprise programmable unijunction transistors.
3. The apparatus of claim 1 in which said switching means comprise transistors.
4. The apparatus of claim 3 in which the transistors comprise a transistor regenerative switch.
5. The apparatus of claim 1 in which said switching means comprise silicon controlled rectifiers.

* * * * *